US008153019B2

(12) United States Patent
Sinha et al.

(10) Patent No.: US 8,153,019 B2
(45) Date of Patent: Apr. 10, 2012

(54) METHODS FOR SUBSTANTIALLY EQUALIZING RATES AT WHICH MATERIAL IS REMOVED OVER AN AREA OF A STRUCTURE OR FILM THAT INCLUDES RECESSES OR CREVICES

(75) Inventors: Nishant Sinha, Boise, ID (US); J. Neil Greeley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 379 days.

(21) Appl. No.: 11/834,258

(22) Filed: Aug. 6, 2007

(65) Prior Publication Data

US 2009/0042401 A1 Feb. 12, 2009

(51) Int. Cl.
*C09K 13/08* (2006.01)
*C11D 7/28* (2006.01)

(52) U.S. Cl. .................... 252/79.3; 252/79.1; 252/79.2; 134/1; 134/1.3; 134/22.12; 134/22.16; 134/22.18; 438/700; 438/707; 438/723; 438/743; 438/745; 438/746; 438/756; 216/17; 216/99; 216/108; 216/109; 510/175

(58) Field of Classification Search ................. 252/79.1, 252/79.2, 79.3; 134/1, 1.3, 22.12, 22.16, 134/22.18; 438/700, 707, 723, 743, 745, 438/746, 756; 216/17, 99, 108, 109; 510/175
See application file for complete search history.

(56) References Cited

U.S. PATENT DOCUMENTS 3,767,491 A * 10/1973 Chough ........................ 438/746
5,496,485 A * 3/1996 Maternaghan ............... 252/79.3
6,063,301 A * 5/2000 Kiwada et al. ................ 216/103
6,129,091 A * 10/2000 Lee et al. .......................... 134/3
2002/0142619 A1* 10/2002 Grabbe et al. ................ 438/753
2005/0040139 A1* 2/2005 Gonzalez et al. ............... 216/83
2005/0218372 A1 10/2005 Brask et al.
2006/0054181 A1* 3/2006 Rayandayan et al. ............ 134/1
2006/0163199 A1* 7/2006 Van Den Meerakker et al. .............................. 216/56
2006/0194404 A1* 8/2006 Dupont et al. ................ 438/397
2006/0240670 A1 10/2006 Bugge et al.
2007/0007241 A1* 1/2007 DeLouise ........................ 216/56
2007/0023396 A1 2/2007 Fucsko et al.
2007/0075290 A1* 4/2007 Mori et al. ................... 252/79.1
2007/0122990 A1* 5/2007 Tanaka et al. ................ 438/357
2007/0293054 A1* 12/2007 Lee et al. ...................... 438/743
2008/0125342 A1* 5/2008 Visintin et al. ................ 510/175
2009/0023265 A1* 1/2009 Mun et al. ..................... 438/397
2010/0320416 A1* 12/2010 Savu et al. ................... 252/79.3

OTHER PUBLICATIONS

PCT International Search Report for Application PCT/US2008/072286 dated Dec. 30, 2008.
"DuPont Zonyl FS-62, Fluorosurfactant," DuPont Product Information, Mar. 2001, 2 pages.
"Novec 4300, Electronic Surfactant," 3M Product Information, 3M Electronics, St. Paul, MN, Sep. 2005, 4 pages.

* cited by examiner

*Primary Examiner* — Charles Boyer
(74) *Attorney, Agent, or Firm* — TraskBritt

(57) ABSTRACT

Methods for preventing isotropic removal of materials at corners formed by seams, keyholes, and other anomalies in films or other structures include use of etch blockers to cover or coat such corners. This covering or coating prevents exposure of the corners to isotropic etch solutions and cleaning solutions and, thus, prevents higher material removal rates at the corners than at smoother areas of the structure or film from which material is removed. Solutions, including wet etchants and cleaning solutions, that include at least one type of etch blocker are also disclosed, as are systems for preventing higher rates of material removal at corners formed by seams, crevices, or recesses in a film or other structure. Semiconductor device structures in which etch blockers are located so as to prevent isotropic etchants from removing material from corners of seams, crevices, or recesses in a surface of a film or other structure at undesirably high rates are also disclosed.

13 Claims, 6 Drawing Sheets

METHODS FOR SUBSTANTIALLY EQUALIZING RATES AT WHICH MATERIAL IS REMOVED OVER AN AREA OF A STRUCTURE OR FILM THAT INCLUDES RECESSES OR CREVICES

FIELD OF INVENTION

The present invention relates generally to methods for wet etching structures or films and, more specifically, to methods for preventing isotropic removal of materials at corners formed by seams, keyholes, and other anomalies in the surfaces of structures or films opening onto exposed surfaces of the structures or films.

BACKGROUND OF RELATED ART

When thin films are deposited in semiconductor device fabrication, seams, keyholes, and other anomalies that include corners at the exposed surface of the film may be formed in the films above recesses in the underlying device. Existing chemistries of isotropic etch (e.g., wet etch or cleaning) processes, such as hydrofluoric acid (HF) (e.g., 100:1 water:HF), buffered oxide etchants (BOE) (e.g., 20:1 water:BOE), and etchants that include ammonium fluoride, dilute HF, and phosphoric acid, will enter the recesses or crevices of such anomalies and remove material from corners of the structure or film bounding the recesses or crevices at a faster rate than the material is removed from smoother (e.g., more planar), exposed, nonrecessed surfaces of the film or other structure. Such undesired amplification of anomalies may occur even when films or other structures that include seams, keyholes, and other anomalies have been polished or planarized, and even when such anomalies are not visible by modern imaging techniques, such as electron microscopy. The increased rate at which material is removed by isotropic etchants from corners may result in amplification of seams, keyholes, and similar anomalies, which enhances the occurrence of nonplanarities in the topography of the etched film or other structure. This phenomenon is particularly undesirable in state-of-the-art semiconductor devices, in which circuit, or "line," widths are about 50 nm or less. These detrimental effects will continue to increase with continued decreases in feature dimensions of state-of-the-art semiconductor devices.

While anisotropic etch (e.g., dry etch) processes may be used to avoid the amplification of seams, keyholes, and similar anomalies into larger surface nonplanarities as material is removed from a structure or film, use of such processes undesirably increases processing time and costs.

Accordingly, wet etchants and wet etch processes that reduce, minimize, or eliminate amplification of seams, keyholes, and similar anomalies are desired.

BRIEF DESCRIPTION OF THE DRAWINGS

In the drawings, in which various features of embodiments of the present invention are depicted.

DETAILED DESCRIPTION

Figure 1:
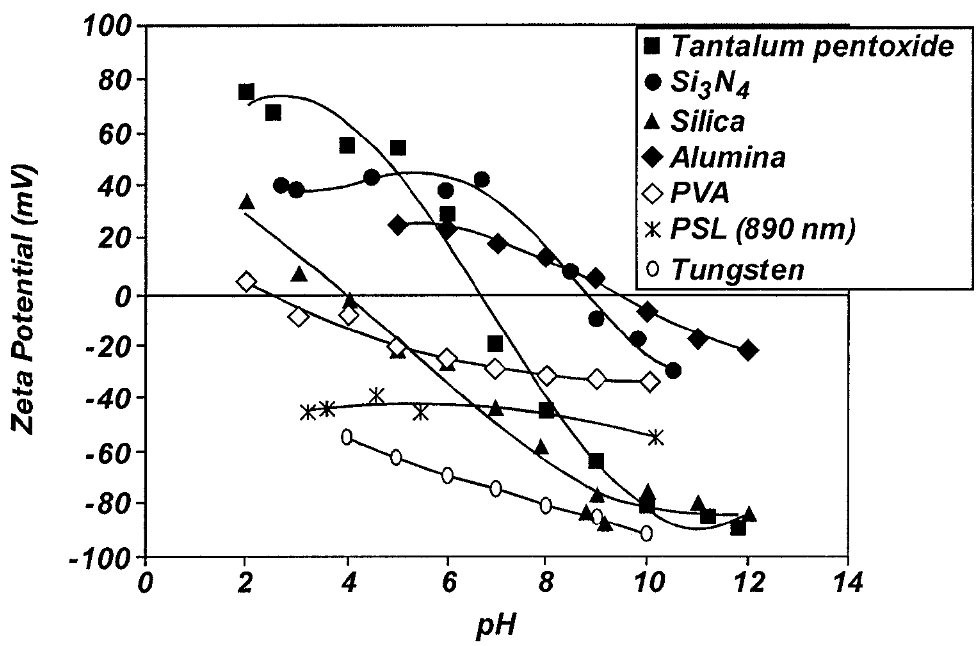
FIG. 1 is a graph illustrating the isoelectric points (IEP—the point at which a molecule has no net electrical charge) of a variety of materials.

The present invention, in one embodiment, includes solutions, including, but not limited to, wet etchants and cleaning solutions, that are formulated, or configured, to prevent an etchant from isotropically removing material from corners of seams, keyholes, and similar anomalies opening onto exposed surfaces of films or other structures that are to be etched or cleaned. As used herein, the term "etchant" includes, but is not limited to, chemicals and mixtures of chemicals that remove material, by dissolution or otherwise; the term "wet etchant" includes, but is not limited to, etchant solutions; the term "etch," inasmuch as use of the term applies to wet etchants, includes, but is not limited to, exposure of a film or structure from which material is to be removed to a wet etchant; the terms "isotropic removal" and "isotropic etch" refer to processes by which material is simultaneously removed from a film or structure in a plurality of different directions; and the term "etch blocker" includes, but is not limited to, elements that may prevent a region of a film or structure from being exposed to an etchant as smoother regions of the film or structure are etched. Etch blockers include particles and molecules, such as surface active agents (which are commonly referred to as "surfactants"), that have molecular weights or dimensions that facilitate their introduction into very small recesses or crevices, such as those of seams, keyholes, and other anomalies, that may be present in a surface of a film or other structure.

The present invention includes etch blockers, etch systems, and methods for preventing, with some selectivity, wet etchants from isotropically removing material from corners of seams, keyholes, and other, similar anomalies opening onto surfaces of films or other structures as material is removed from the surfaces of the films or other structures by isotropic etch processes (e.g., with wet etchants).

The present invention also includes etch blockers that adsorb nonselectively to a structure from which material is to be removed to serve as diffusion barriers, as well as etch systems and methods that employ such diffusion barriers. In some embodiments, diffusion barriers may decrease the rates at which reactive etch species are transported to or, more generally, otherwise become exposed to, a material to be removed. Some embodiments of diffusion barriers may decrease the rates at which products, including by-products, of an etching reaction are removed.

Etch blocker-containing solutions, including wet etchants and cleaning solutions, according to an embodiment of the present invention are configured to prevent the removal of material from corners of seams, keyholes, and similar anomalies in surfaces of films that are to be etched isotropically; i.e., more quickly the material is removed from smoother (e.g., more planar) regions.

The etch blocker of some embodiments of the present invention comprises a particle or molecule with a molecular weight or dimensions that facilitate its preferential introduction into small recesses or crevices, such as seams and keyholes, in a film or other structure that is to be etched. The molecular weight or dimensions of the etch blocker may be large enough to plug a recess or crevice into which the etch blocker is introduced.

The etch blocker may be selected on the basis of its ability to adsorb to surfaces of anomalies of the film or other structure, for example, by van der Waals bonding or by charge differences between the etch blocker and the material of the film (i.e., the mutual attraction that positive charges and negative charges have for each other), and other types of chemisorption, etc. Of course, when an etch blocker adsorbs to and coats a surface that is to be shielded from an isotropic etchant, a single molecule or particle of etch blocker need not have dimensions sufficient to plug a recess or crevice.

Such an etch blocker may prevent isotropic removal of the material from corners or anomalies at undesirably high rates relative to the rates at which material is removed from surfaces of a structure or film by preventing isotropic etchants from contacting (e.g., by adsorbing to, physically covering, etc.) material at corners of structure or film that would otherwise be exposed to the isotropic etchants.

In other embodiments, the etch blocker comprises particles or molecules that nonselectively adsorb to and coat at least a material that is to be removed by etch processes, including both smooth features and anomalies. A non-selectively adsorbing etch blocker acts as a diffusion barrier, which may decrease the rates at which reactive etch species are exposed to a material to be removed, decrease the rates at which products, including by-products, of an etching reaction are removed, or slow both of these types of diffusion.

The etch blocker may comprise a surfactant. When a surfactant is employed as the etch blocker, it may be selected, at least in part, on the basis of an isoelectric point of the material to be etched. FIG. 1 is a graph that shows the zeta potentials of a variety of materials at different pHs. The pH at which the zeta potential of a material is zero is the isoelectric point of that material. In addition, the surfactant may be selected on the basis of the pH of the etch solution with which the etch blocker is to be used relative to the isoelectric point of the material to be removed. As an example, if a material to be removed has an isoelectric point of about 2.5 and the etch solution selected to remove that material has a pH of less than about 2.5, an anionic (i.e., negatively charged) surfactant may be used. As another example, if an etch solution having a pH of greater than about 2.5 is used to remove a material with an isoelectric point of about 2.5, the wet etchant of which the etch solution is a part may also include cationic (i.e., positively charged) surfactant.

Another embodiment of etch blocker includes a surface active polymer, which may be selected based on its ability to physically adsorb, or "physisorb," to a particular material to be etched (e.g., silicon dioxide). Specific embodiments of surface active polymers include polyethylene glycol (PEG), polyvinyl pyrrolidine (PVP), and polyacrylic acid (PAA). When surface active polymers are used with an etchant having a high ionic strength (e.g., BOE, etc.) the high ionic strength of the etchant will compress an electric double layer that includes charged molecules and charged surfaces, reducing the attractive forces that are required for such an etch blocker to adsorb to the material to be etched, and enabling the use of less ionic or non-ionic surfactants as and polymers.

In another embodiment, nonionic surfactants, which lack positive and negative charges, may be useful as etch blockers regardless of the isoelectric point of the material to be removed or the pH of the etch solution. Amphoteric surfactants, which include both positively charged and negatively charged regions, may also be used as etch blockers of a wet etchant according to a further embodiment of the invention.

ZONYL® FS-62, an anionic fluorosurfactant available from E. I. du Pont de Nemours and Company of Wilmington, Del., NOVEC® 4300 electronic surfactant, an anionic fluorosurfactant available from the 3M Company of Maplewood, Minn., and ammonium lauryl sulfate (ALS) are nonlimiting examples of anionic surfactants that may be useful as an etch blocker in a wet etchant according to embodiments of the present invention. Cetyl trimethylammonium bromide (CTAB), also referred to as "hexadecyltrimethylammonium bromide," is a nonlimiting example of a cationic surfactant that may be useful in a wet etchant according to embodiments of the present invention. TRITON® X-100, a nonionic surfactant having the chemical formula $C_{14}H_{22}O_2(C_2H_4O)_n$, with a hydrophilic polyethylene oxide group (on average it has 9.5 ethylene oxide units) and a hydrocarbon lipophilic or hydrophobic group comprising a 4-(1,1,3,3-tetramethylbutyl)-phenyl group, and available from Union Carbide Corporation of Houston, Tex., is an example of a nonionic surfactant that may be included in a wet etchant of embodiments of the present invention.

According to another embodiment, the etch blocker may be a particulate etch blocker that does not adsorb to, but has a configuration and dimensions that facilitate its receipt within recesses or crevices of an exposed surface being etched, either passively or with some action (e.g., vibration, a small amount of turbulence in the solution, etc.). Without limiting the scope of the present invention, such an etch blocker may be geometrically optimized (e.g., rounded, etc.) to facilitate its introduction into recesses or crevices, configured somewhat complementarily to the recesses or crevices within which it is to be received, modified to have a tailored steric hindrance, or otherwise modified, as may facilitate introduction and/or retention (e.g., when pressure waves are used to remove etch blocker from smoother surfaces of the structure or film to be etched) of the etch blocker into the recesses or crevices.

An etch blocker-containing solution of the present invention may be configured to facilitate removal of material by a wet etchant, other isotropic etchant, or cleaning solution, without leaving surface roughness anomalies that are large enough to affect the performance of the resulting structure (e.g., a semiconductor device structure). Such a solution includes, among other things, at least one etch blocker for preventing material at corners in the film surface from being removed at a significantly faster rate than material is removed from smoother (e.g., more planar) surfaces of the film and, optionally, an etchant or cleaning solution for chemically etching one or more materials.

An etch blocker-containing solution of the present invention may include an etch solution in addition to the etch blocker. The etch solution of such a wet etchant is configured to remove a material of the film. The etch solution, as well as the concentrations of one or more chemicals thereof, may be selected based on a variety of known factors, including its ability to remove the desired material or materials, the rate at which it removes the desired material or materials, the conditions in which material removal may be effected, the selectivity with which it removes the desired material or materials over other materials, its compatibility with photoresist (which may be present when STI shallow trench isolation structures are recessed, such as in NAND flash fabrication processes), and other factors. Embodiments of a wet etchant of the present invention include an etch solution and etch blocker that are compatible with one another. For example, the chemical properties (e.g., ionic strength, pH, etc.) of the etch solution may allow the etch blocker to cover (e.g., adsorb to) an anomaly in a surface of a structure or film that is to be etched, and may even facilitate coating desired regions of the structure or film with the etch blocker.

Systems and methods according to embodiments of the present invention are now described with reference to FIGS. 2-8.

Figure 2:
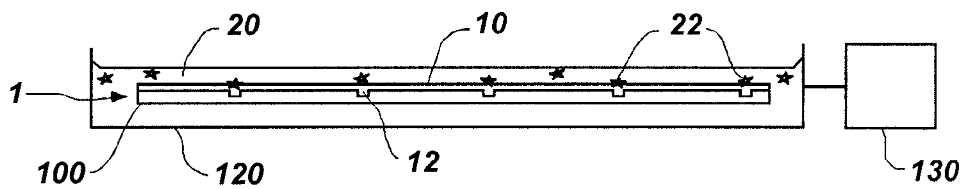
FIG. 2 is a schematic representation of an embodiment of the present invention for preventing removal or decreasing the rate at which material is isotropically removed from corners of seams, crevices, or recesses of a structure of a film.

As depicted in FIG. 2, a fabrication substrate 100 may be carried by a substrate holder 120 of a system 1 of an embodiment of the present invention as a method according to an embodiment of the present invention is effected. As used herein, the term "fabrication substrate" includes, without limitation, full or partial semiconductor (e.g., silicon, gallium arsenide, indium phosphide, etc.) wafers, a silicon-on-insulator (SOI) type substrates (e.g., silicon-on-ceramic (SOC), silicon-on-glass (SOG), silicon-on-sapphire (SOS), etc.), and the like. System 1 may also include means for generating pressure waves 130, which are associated with substrate holder 120 in such a way as to generate pressure waves in a solution 20 that may include a wet etchant on at least a portion of fabrication substrate 100 within substrate holder 120.

Means 130 for generating pressure waves may comprise an ultrasonic vibrator configured to initiate and control amplitude and frequency of vibrations and having one or more transmission elements (e.g., transducers) operably coupled to the volume of solution 20 and positioned to initiate and control the direction, amplitude and frequency of waves stimulated in solution 20. The vibrator may be operable to superimpose waves of varying frequency and amplitude to create turbulence (eddies, vortices, etc.), in solution 20 to initiate a "scrubbing" effect to selectively remove etch blockers 22 from major surfaces of a film on fabrication substrate 100 oriented substantially parallel to the major plane thereof.

Turbulence formed by pressure wave generator 130 and solution 20, as referenced above, acts on fluid in a recess or crevice to a depth of approximately 300 Å. Thus, turbulence can be effectively employed to scrub etch blockers, such as surfactants, from an exposed surface of a film or other structure, while allowing the etch blocker to reside within the recess or crevice.

In another embodiment, means for generating pressure waves 130 may include a single-wafer spin tool of a type known in the art, which may include apparatus for spraying or otherwise dispensing solution 20 onto an exposed surface of fabrication substrate 100. One or both of the centrifugal force generated by spinning and the force with which solution 20 is applied to a surface of fabrication substrate 100 may result in the selective removal of the etch blocker from exposed surfaces, while allowing the etch blocker to remain within recessed locations.

Another embodiment of means for generating pressure waves 130 includes a batch cleaning tool, such as a cleaning tool with a recirculating tank or a spray tool, which cause fluids to move across (substantially parallel to) or impact (transverse to) surfaces of a fabrication substrate 100 (e.g., by recirculation current or spray) at relatively high velocity. Examples of batch cleaning tools are available from TEL (Tokyo Electron) of Tokyo, Japan, and DNS Electronics of Sunnyvale, Calif. When a batch cleaning tool is employed as a means for generating pressure waves 130, a surface of fabrication substrate 100 may be exposed to solution 20 while fabrication substrate 100 is within the batch cleaning tool.

Figure 3:
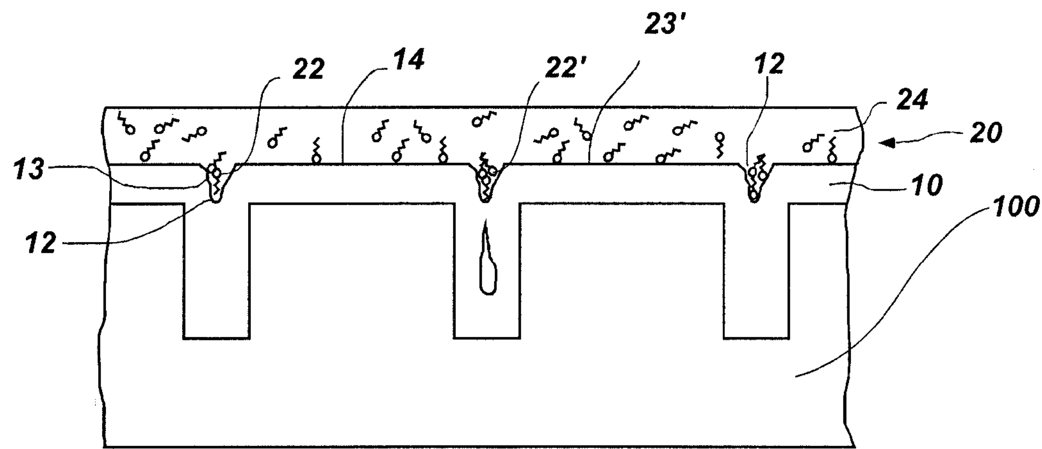
FIG. 3 is a cross-sectional representation that illustrates the introduction of etch blockers into recesses or crevices of a structure or film from which material is to be removed according to an embodiment of the present invention.

In an embodiment of a method of the present invention, etch blockers 22 are introduced into recesses or crevices 12 of an exposed surface 14 of structure or film 10 from which material is to be removed, as represented in FIG. 3. Without limiting the scope of the present invention, etch blockers 22 may be part of, or carried by, a solution 20. In other embodiments, etch blockers 22 may be part of a non-etching solution, in which case a separate wet etchant may be used in conjunction with the etch blocker 22-containing solution. When a structure or film 10 and recesses or crevices 12 thereof are exposed a solution that includes etch blocker 22, etch blocker 22 may adsorb to or merely cover surfaces 13 of structure or film 10 that are located within recesses or crevices 12.

The introduction of etch blockers 22 onto a structure or film 10 may be effected in a selective fashion, in which etch blocker 22 is introduced into recesses or crevices 12 without substantially remaining on smooth (e.g., substantially planar), nonrecessed, exposed surfaces 14 of structure or film 10, such as those surfaces oriented substantially parallel to the major plane of fabrication substrate 100 (e.g., into a seam of an STI structure). In this regard, and with reference to FIG. 4, any etch blocker 22 present on smooth (e.g., substantially planar), nonrecessed, exposed surfaces 14 of structure or film 10 following the introduction of etch blocker 22 into recesses or crevices 12 may be removed. As a nonlimiting example, at least some etch blocker 22 may be removed from smooth, nonrecessed, exposed surfaces 14 by way of pressure waves 30. When etch blocker 22 is part of or carried by a solution 20, etch blocker 22 on smooth, nonrecessed, exposed surfaces 14 may be removed by generating pressure waves 30 (e.g., in the form of turbulence) within solution 20. Pressure waves 30 (e.g. turbulent movement of solution 20) may extend or travel in a direction that is substantially parallel to the smooth, nonrecessed, exposed surface 14 from which etch blocker 22 is to be removed. This orientation of pressure waves 30 minimizes their introduction (e.g., the turbulent flow of solution 20) into recesses or crevices 12, as well as the formation of bubbles within recesses or crevices 12, leaving etch blocker 22 within recesses or crevices 12 substantially undisturbed. The amplitude of pressure waves 30 may also be optimized to facilitate removal of etch blocker 22 from smooth, nonrecessed, exposed surfaces 14 while minimizing the depth that pressure waves 30 intrude into recesses or crevices 12.

Without limiting the scope of the present invention, pressure waves 30, in the form of turbulence (e.g., random eddies, vortices, and other flow fluctuations) in solution 20, may be induced by cavitation, sonication, or any other suitable technique 130 for generating pressure waves 30 (see FIG. 2) or causing fluid to move across a surface of fabrication substrate 100 that are known in to those of ordinary skill in the art.

Material removal or surface cleaning occur as soon as a solution 20 that includes a wet etchant or cleaning solution, respectively, contacts surfaces, including smooth, nonrecessed, exposed surfaces 14, of structure or film 10, during or after the introduction of etch blocker 22 into recesses or crevices 12 and removal of etch blocker 22 from smooth, nonrecessed, exposed surfaces 14. In one embodiment, when etch blocker 22 is carried by or is part of a solution 20 that also includes or comprises an etchant 24 (see FIGS. 3 and 4) for removing material from structure or film 10, material removal may occur while the material is exposed to solution 20. In another embodiment, when solution 20 does not include any etchant 24, etchant 24 may be added to solution 20, or solution 20 may be substantially removed from structure or film 10 as soon as material removal is desired.

Figure 5:
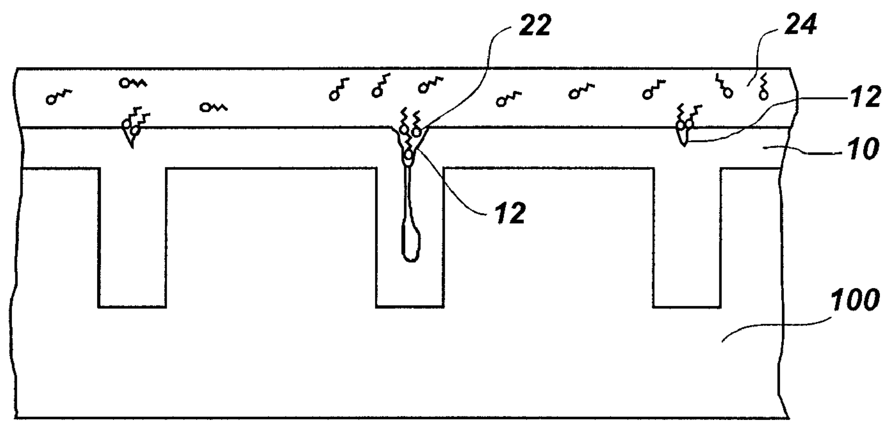
FIGS. 5 and 6 are cross-sectional representations of the structure or film of FIG. 4 that illustrate the removal of material from the structure or film with etch blockers within recesses or crevices of the structure or film according to an embodiment of the present invention.
Figure 6:
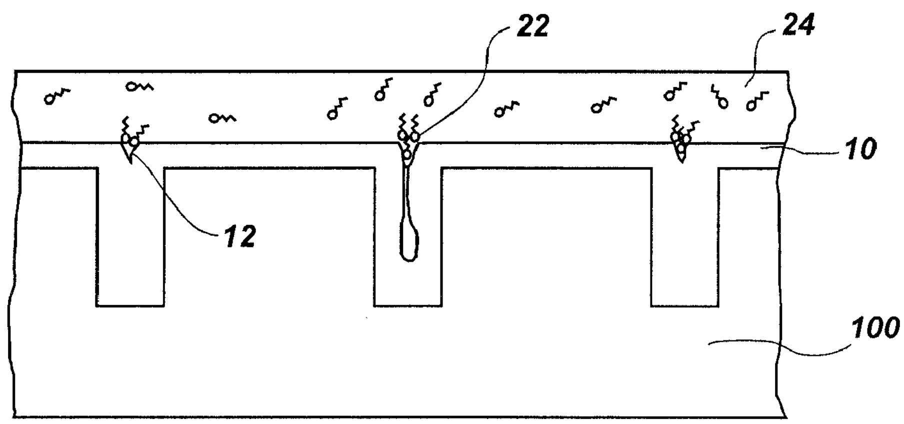
Figure 7:
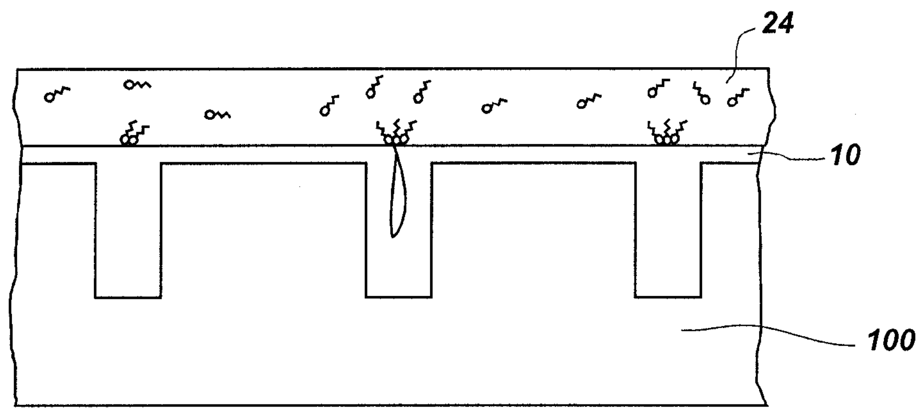
FIG. 7 shows the structure or film of FIG. 6, with material having been removed from smooth, nonrecessed surfaces thereof to about a lowermost level or elevation at which blockers are present, according to an embodiment of the present invention.

As FIGS. 5 and 6 illustrate, upon contacting structure or film 10, etchant 24 removes material from structure or film 10. Etchant 24 is prevented from contacting regions or features of structure or film 10 that are covered or coated by etch blocker 22 and, thus, etch blocker 22 prevents or hinders the removal of material from these regions. Use of an etch blocker 22 in his manner facilitates the removal of material from structure or film 10 until substantially no undesirable recesses or crevices 12 remain in the nonrecessed, exposed surface of structure or film 10, as shown in FIG. 7. Removal to the extent depicted in FIG. 7 may be effected by exposing structure or film 10 to etchant 24 for a predetermined period of time, at a predetermined temperature, at a predetermined concentration, using a combination of the foregoing, or otherwise, as known to those of ordinary skill in the art.

Figure 8:
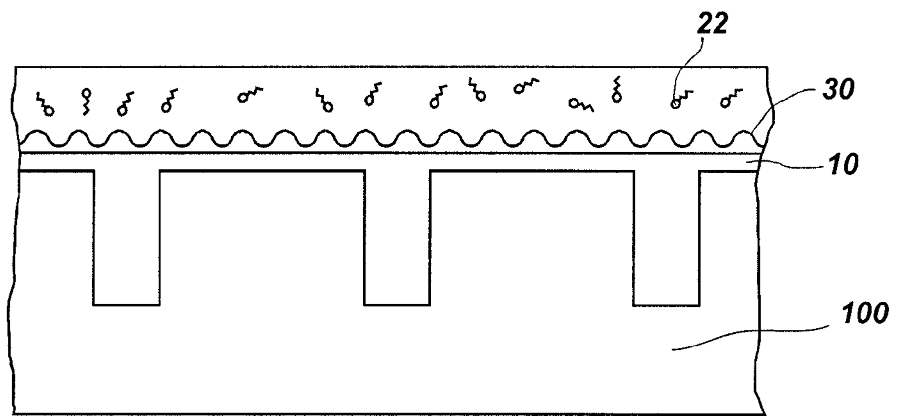
FIG. 8 shows the structure or film of FIG. 7, from which etch blockers have been substantially removed according to an embodiment of the present invention.

If further material removal is desired after the point depicted in FIG. 7, etch blocker 22 may be substantially removed from structure or film 10, such as by the generation of pressure waves 30, as described with reference to FIG. 4, by washing and rinsing processes, as known in the art, or by any other suitable known technique, as shown in FIG. 8. Further material removal may then be effected in any suitable manner known in the art (e.g., oxygen ($O_2$) ashing processes are useful for removing organic materials, etc.).

Figure 4:
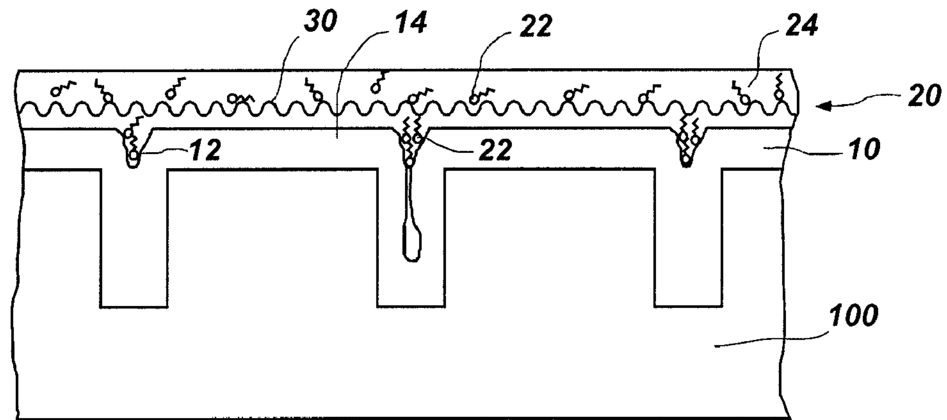
FIG. 4 is a cross-sectional representation showing the removal of the etch-blocker of FIG. 3 from undesired locations of a structure or film according to an embodiment of the present invention.

In other embodiments, shown in FIGS. 3 and 4, an etch blocker 22' may be nonselectively adsorbed to exposed surfaces 14 of structure of film 10. In such embodiments, etch blocker 22' may comprise a surface active polymer, a nonionic or low ionic strength surfactant, or any other suitable material. When etch blocker 22' is used with an etchant that has a high ionic strength (e.g., a BOE, etc.), the ionic strength of the etchant may compensate for low attractive forces of etch blockers 22' to exposed surfaces 14. Thus, etch blocker 22' may nonspecifically adsorb to and coat exposed surfaces 14.

As shown in FIG. 3, an exposed surface 14 of a structure or film 10 that is to be subjected to material removal (e.g., etching) processes is exposed to an etchant mixture 18 that includes a solution 20 with etch blocker 22' dispersed therethrough. Etch blocker 22' may comprise about one percent or less of the volume of the components of an etchant mixture, but may comprise as much as about twenty percent of the volume of the etchant mixture. FIG. 3 illustrates the nonselective adsorption of etch blocker 22' to exposed surface 14 and, thus, a coating 23' of etch blocker 22' on exposed surface 14. Coating 23' acts as a diffusion barrier that physically impedes the mass transport of reactive etch species to exposed surface 14 and the removal of etch by-products from exposed surface 14. As illustrated, material removal processes are shown in which in which coating 23' enables an isotropic etchant to remove material from all areas of exposed surface 14, including regions of exposed surface 14 with recesses or crevices, at substantially the same rate.

Once a desired amount of material has been removed from structure or film 10, etchant mixture 18, including coating 23', may be removed from structure or film 10, as shown in FIG. 4, by any known, suitable process (e.g., by rinsing, washing, etc.).

Solutions, processes, or combinations thereof, of embodiments of the present invention may be used in a variety of applications and readily and cost-effectively incorporated into a variety of existing processes. The solutions, processes, and combinations thereof are particularly useful for removing materials in which seams, keyholes, or other recesses or crevices are formed following deposition of the materials in recesses, such as trenches, including during material removal (e.g., etching) and cleaning processes (e.g., from STI structures, from conductive contact plugs, etc.). Wet etchants and processes of the present invention may be used to remove materials from or from above structures or features having at least one dimension of about 50 nm or less.

For example, wet etchants and processes of the present invention may be used to recess the materials (e.g., ozone-tetraethyl orthosilicate (TEOS), etc.) of shallow trench isolation (STI) structures of semiconductor devices that include floating NAND gates. As another example, etchants and/or processes according to the present invention may be used to wet etch structures (e.g., plugs, etc.) including tungsten (W), titanium nitride (TiN), polysilicon, or other materials (e.g., wet etchback of 42 level W/TiN contact plugs, etc.).

The following are nonlimiting examples of etchants and that have been used to recess ozone-TEOS silicon dioxide of STI structures:

EXAMPLE 1

Figure 9:
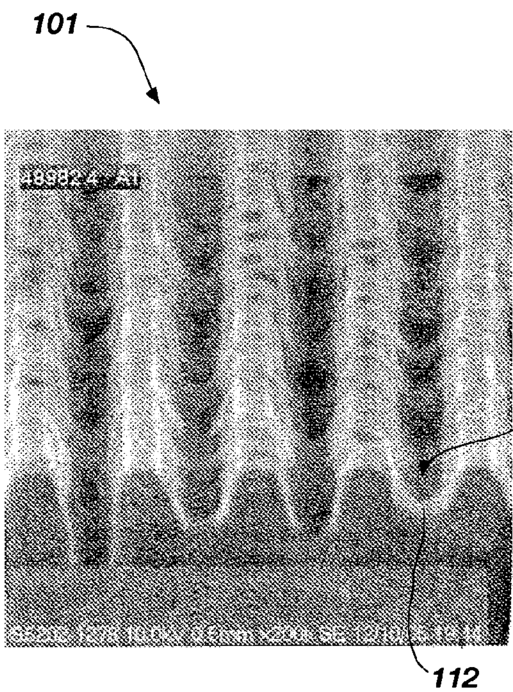
FIGS. 9 through 15 are electron micrographs depicting various embodiments of processes according to the present invention.

With reference to FIG. 9, semiconductor device structures 101 including STI structures 110 with recesses or crevices 112 were exposed for 10 (ten) minutes to a BOE etch solution diluted 100:1 and at a pH of about 6. Each etch was accompanied by sonication in a lateral direction, substantially parallel to a plane in which a substrate bearing each semiconductor device structure 101 was located. In a control, shown in FIG. 9, a semiconductor device structure 101 was exposed just to the etch solution. In addition, semiconductor device structures 101 were exposed for ten minutes each to the etch solution with 0.1 mM CTAB and with 1 mM CTAB.

Figure 10:
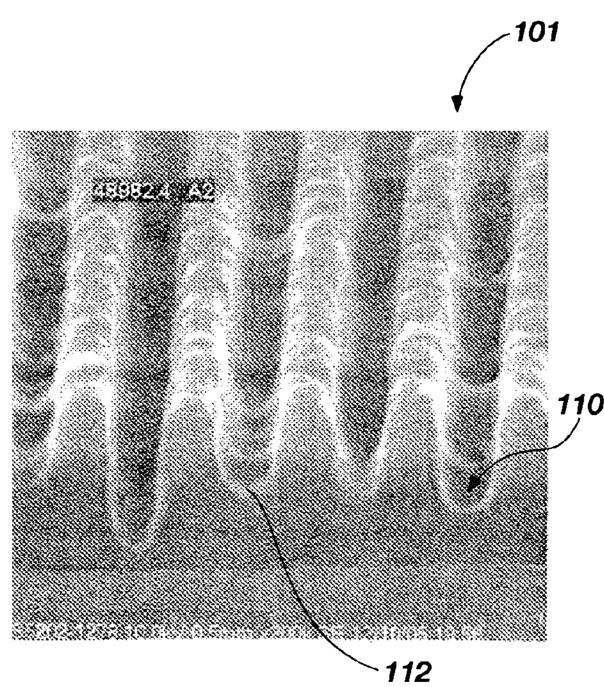
Figure 11:
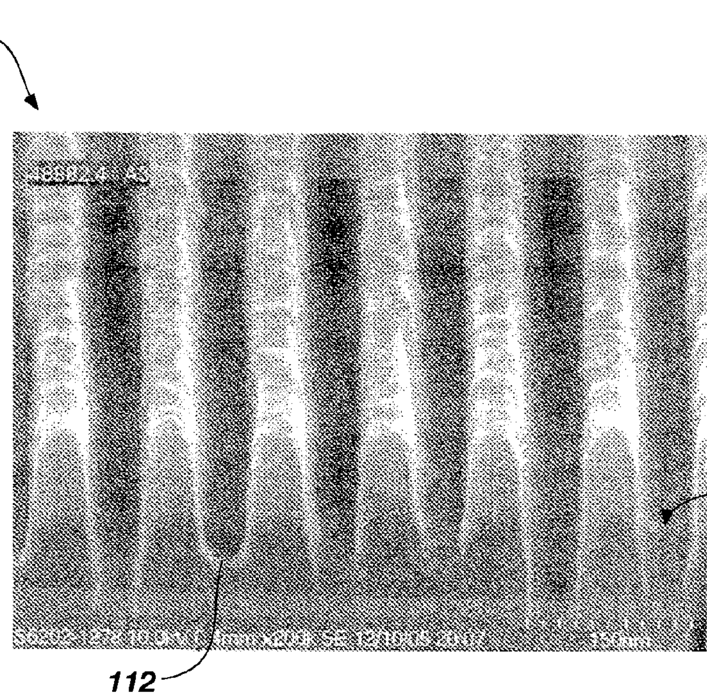

The results of these etches are shown in FIGS. 10 (0.1 mM CTAB) and 11 (1 mM CTAB), respectively. It does not appear that the addition of CTAB to the etch solution improved the manner in which the etch solution removed material from STI structures 110, as the ionic strength of the etch solution likely prevented the CTAB from adsorbing to desired locations (i.e., surfaces within recesses or crevices 112 of STI structures 110). These results indicate that less acidic, and even basic, etchants may be suitable for use with cationic surfactants, particularly in situations where cationic surfactants are more likely to adsorb to a material than anionic surfactants.

EXAMPLE 2

Figure 12:
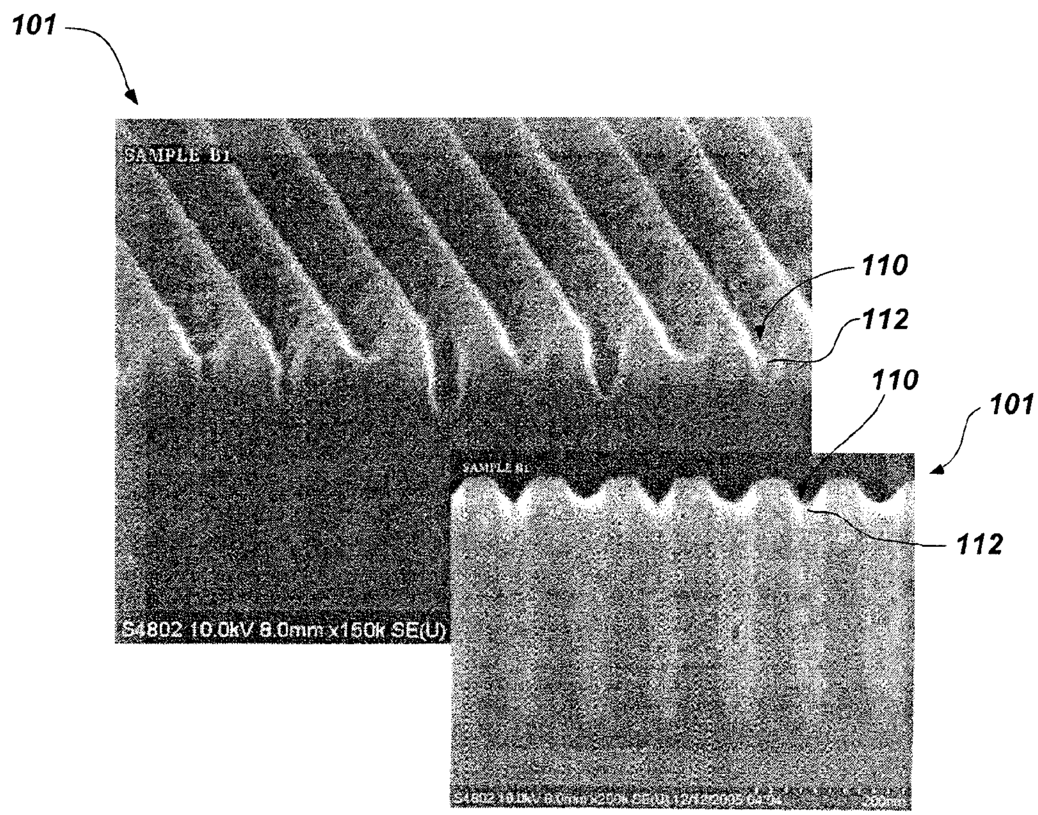
Figure 13:
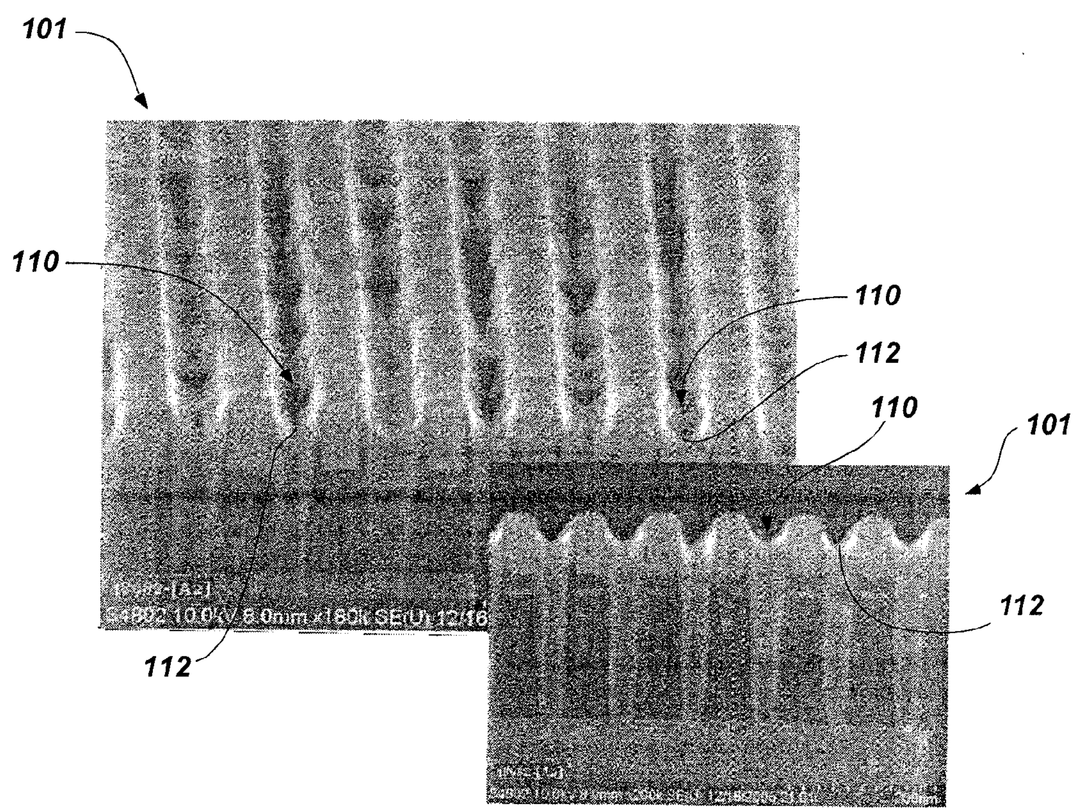

In another experiment, silicon dioxide of STI structures 110 including recesses or crevices 112 were etched with dilute (100:1) HF at a pH of about 1.5 for about 7 (seven) minutes to about 8 (eight) minutes. Each etch was accompanied by sonication in a lateral direction. The results of a control etch (dilute HF alone) are shown in FIG. 12, while the results of an etch in which 0.01% FS-62 was included are shown in FIG. 13.

As shown, the inclusion of FS-62 as an etch blocker prevents isotropic etching at recesses or crevices 112 within STI structures 110.

EXAMPLE 3

Figure 14:
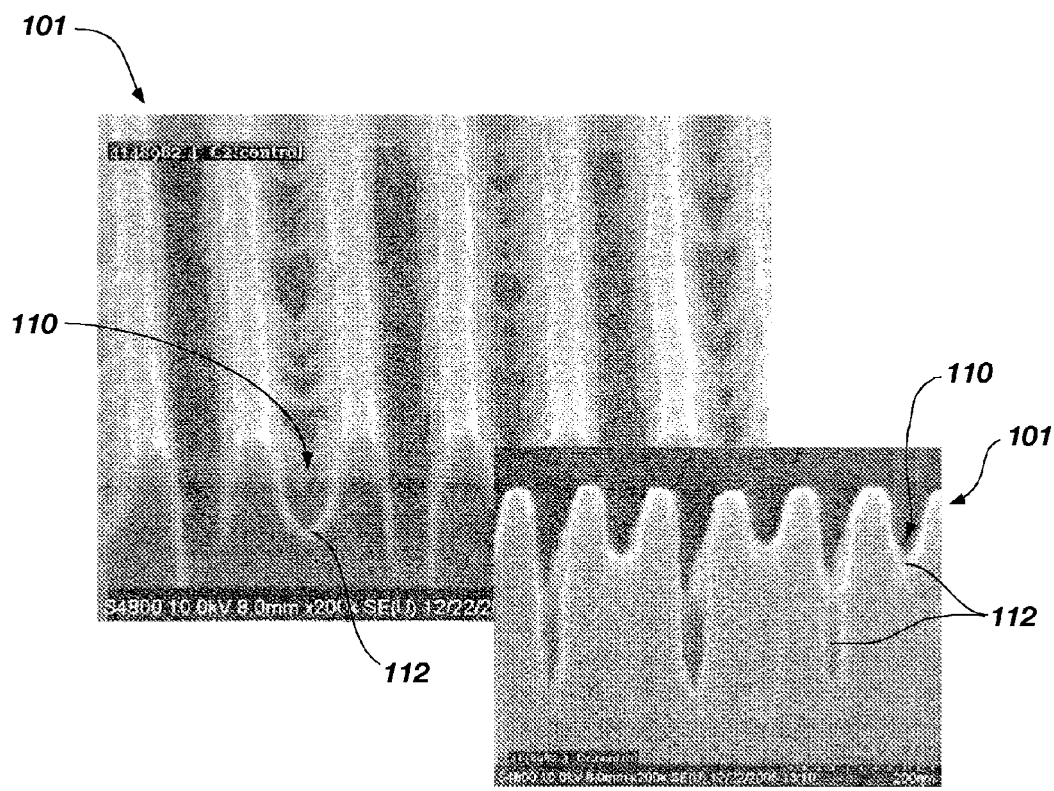
Figure 15:
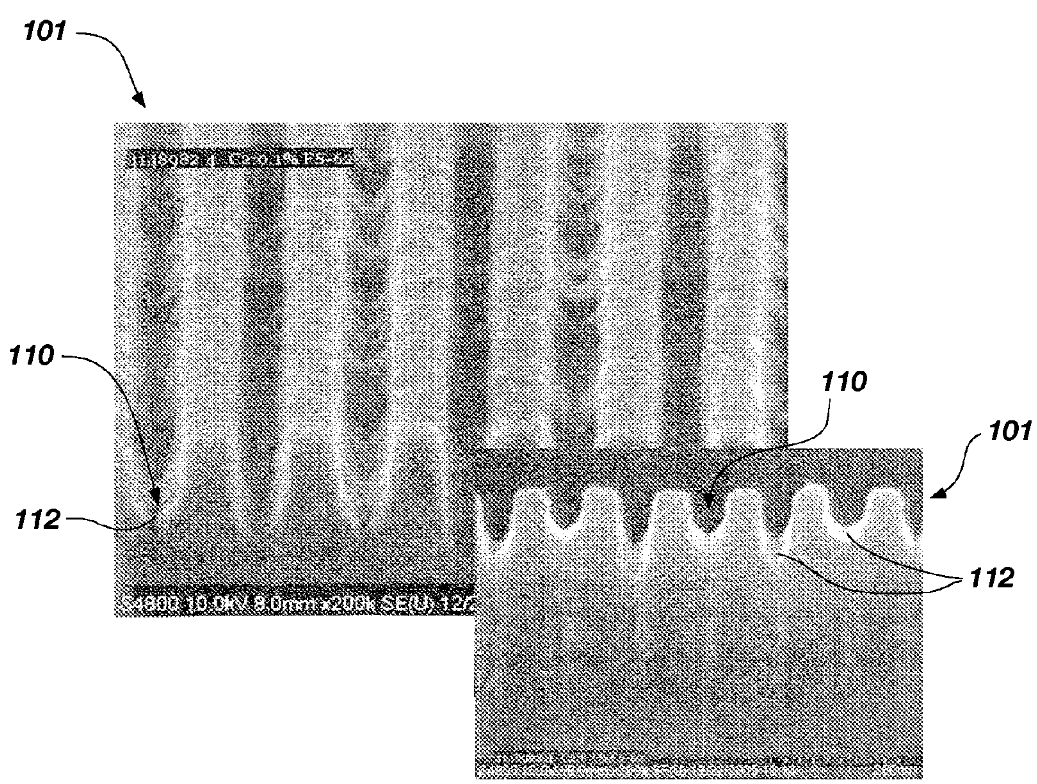

In a variation of the experiment set forth in EXAMPLE 2, silicon dioxide of STI structures 110 that included recesses or crevices 112 were etched with dilute (100:1) HF at a pH of about 1.5 for about 8 (eight) minutes. Each etch was accompanied by sonication in a lateral direction. The results of a control etch are shown in FIG. 14, while the results of an etch in which 0.01% FS-62 was included are shown in FIG. 15.

As shown, the inclusion of FS-62 as an etch blocker prevents isotropic etching at recesses or crevices 112 within STI structures 110.

Although the foregoing description contains many specifics, these should not be construed as limiting the scope of the present invention, but merely as providing illustrations of some of the presently preferred embodiments. Similarly, other embodiments of the invention may be devised which do not depart from the spirit or scope of the present invention. Features from different embodiments may be employed in combination. The scope of the invention is, therefore, indicated and limited only by the appended claims and their legal equivalents, rather than by the foregoing description. All additions, deletions and modifications to the invention as disclosed herein which fall within the meaning and scope of the claims are to be embraced thereby.

What is claimed:

1. A method for isotropic etching, comprising:

exposing a structure comprising silicon dioxide and having at least one crevice or recess at an exposed surface thereof to a wet etchant consisting of hydrogen fluoride, water, and at least one fluorosurfactant, the at least one fluorosurfactant comprising at least one of $CF_3CF_2CF_2CF_2CF_2CF_2CH_2CH_2SO_3X$, where X is H or $NH_4$, and an ammonium fluoroalkylsulfonate; and generating pressure waves in the wet etchant to remove the at least one fluorosurfactant from the exposed surface of the structure while the at least one fluorosurfactant remains within the at least one crevice or recess.

2. The method of claim 1, wherein exposing a structure comprising silicon dioxide and having at least one crevice or recess at an exposed surface thereof to a wet etchant comprises exposing a silicon dioxide shallow trench isolation structure to the wet etchant.

3. The method of claim 1, further comprising selecting the at least one fluorosurfactant based at least in part upon an isoelectric point of the silicon dioxide.

4. A method for fabricating a semiconductor device structure, comprising:

exposing a film or structure comprising silicon dioxide and having at least one anomaly extending from a substantially smooth surface thereof to a wet etchant consisting of hydrogen fluoride, water, and at least one fluorosurfactant, the at least one fluorosurfactant comprising at least one of $CF_3CF_2CF_2CF_2CF_2CF_2CH_2CH_2SO_3X$, where X is H or $NH_4$, and an ammonium fluoroalkylsulfonate; and generating pressure waves across a surface of the film or structure.

5. The method of claim 4, wherein generating pressure waves across a surface of the film or structure comprises removing the fluorosurfactant from substantially smooth surfaces while the fluorosurfactant remains within the at least one anomaly.

6. A method for fabricating a semiconductor device structure, comprising:

applying an etchant mixture consisting of hydrogen fluoride, water, and at least one fluorosurfactant to an exposed surface of a silicon dioxide structure from which material is to be removed, the at least one fluorosurfactant comprising at least one of $CF_3CF_2CF_2CF_2CF_2CF_2CH_2CH_2SO_3X$, where X is H or $NH_4$, and an ammonium fluoroalkylsulfonate and absorbing to surfaces of the silicon dioxide structure defining at least one crevice or recess therein and enabling removal of material from all areas of the exposed surface, including exposed regions of the at least one crevice or recess, at substantially the same rate.

7. The method of claim 6, wherein applying an etchant mixture comprises applying an etchant mixture having a pH of about 1.5.

8. The method of claim 6, wherein applying an etchant mixture comprises applying an etchant mixture in which the hydrogen fluoride and water are present in a ratio of about 1:100.

9. The method of claim 6, wherein applying an etchant mixture comprises applying an etchant mixture including at most about one percent, by volume, of the at least one fluorosurfactant.

10. The method of claim 6, wherein applying an etchant mixture comprises applying an etchant mixture including at most about twenty percent, by volume, of the at least one fluorosurfactant.

11. The method of claim 1, wherein generating pressure waves in the wet etchant to remove the at least one fluorosurfactant from the exposed surface of the structure while the at least one fluorosurfactant remains within the at least one crevice or recess comprises removing material from unrecessed surfaces of the structure without removing material from surfaces of the structure defining the at least one crevice or recess.

12. The method of claim 1, wherein exposing a structure comprising silicon dioxide and having at least one crevice or recess at an exposed surface thereof to a wet etchant comprises exposing a silicon dioxide shallow trench isolation structure having the at least one crevice or recess therein to a wet etchant consisting of hydrogen fluoride, water, and at least one fluorosurfactant to remove material from unrecessed surfaces of the silicon dioxide shallow trench isolation structure.

13. The method of claim 1, wherein generating pressure waves in the wet etchant to remove the at least one fluorosurfactant from the exposed surface of the structure while the at least one fluorosurfactant remains within the at least one crevice or recess comprises generating pressure waves in the wet etchant in a direction substantially parallel to a major surface of a film that has been conformally deposited to fill at least one contact hole or trench to remove the at least one fluorosurfactant from unrecessed surfaces of the film while the at least one fluorosurfactant remains within the at least one crevice or recess located over the at least one contact hole or trench.

* * * * *